United States Patent
Mori

(10) Patent No.: US 12,418,263 B2
(45) Date of Patent: Sep. 16, 2025

(54) OSCILLATOR CIRCUIT

(71) Applicant: SEIKO EPSON CORPORATION, Tokyo (JP)

(72) Inventor: Ryoga Mori, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 18/757,961

(22) Filed: Jun. 28, 2024

(65) Prior Publication Data

US 2025/0007461 A1   Jan. 2, 2025

(30) Foreign Application Priority Data

Jun. 30, 2023   (JP) ................... 2023-107981

(51) Int. Cl.
*H03B 5/32* (2006.01)

(52) U.S. Cl.
CPC ..................... *H03B 5/32* (2013.01)

(58) Field of Classification Search
CPC .................. H03B 5/32; H03B 5/364
See application file for complete search history.

(56) References Cited

U.S. PATENT DOCUMENTS

2021/0194429 A1*   6/2021   Seth .............. H03B 5/362

FOREIGN PATENT DOCUMENTS

| JP | S54-61447 A | 5/1979 |
|---|---|---|
| JP | H8-23230 A | 1/1996 |

* cited by examiner

*Primary Examiner* — Jeffrey M Shin
(74) *Attorney, Agent, or Firm* — Rankin, Hill & Clark LLP

(57) ABSTRACT

An oscillator circuit includes: an inverter; a crystal oscillator coupled in parallel to the inverter; a first load capacitor coupled to an input portion of the crystal oscillator; a second load capacitor coupled to an output portion of the crystal oscillator; and a band stop filter coupled in parallel to the inverter and having a rejection band including a resonant frequency of the crystal oscillator. Also, the band stop filter is a twin-T notch filter.

5 Claims, 5 Drawing Sheets

OSCILLATOR CIRCUIT

The present application is based on, and claims priority from JP Application Serial Number 2023-107981, filed Jun. 30, 2023, the disclosure of which is hereby incorporated by reference herein in its entirety.

BACKGROUND

1. Technical Field

The present disclosure relates to an oscillator circuit.

2. Related Art

Crystal oscillator circuits described in JP-A-54-061447 and JP-A-08-023230 each include a corresponding CMOS inverter coupled between a power source and ground. Also, a series circuit including an output resistor and a crystal oscillator, and a DC feedback resistor are coupled in parallel between the input end of the inverter and the output end thereof. Also, one end of the crystal oscillator is coupled to one end of a first load capacitor, and the other end of the crystal oscillator is coupled to one end of a second load capacitor. In JP-A-54-061447, the other ends of the first and the second load capacitors are coupled to the power source. In JP-A-08-023230, the other ends of the first and the second load capacitors are coupled to ground.

However, with the crystal oscillator circuits described in JP-A-54-061447 and JP-A-08-023230, noise is likely to increase due to their configurations.

SUMMARY

According to an aspect of the present disclosure, there is provided an oscillator circuit including: an inverter; a crystal oscillator coupled in parallel to the inverter; a first load capacitor coupled to an input portion of the crystal oscillator; a second load capacitor coupled to an output portion of the crystal oscillator; and a band stop filter coupled in parallel to the inverter and having a rejection band including a resonant frequency of the crystal oscillator.

DESCRIPTION OF EMBODIMENTS

In the following, a detailed description will be given of an oscillator circuit according to the present disclosure in accordance with embodiments described with reference to the attached drawings.

First Embodiment

Figure 1:
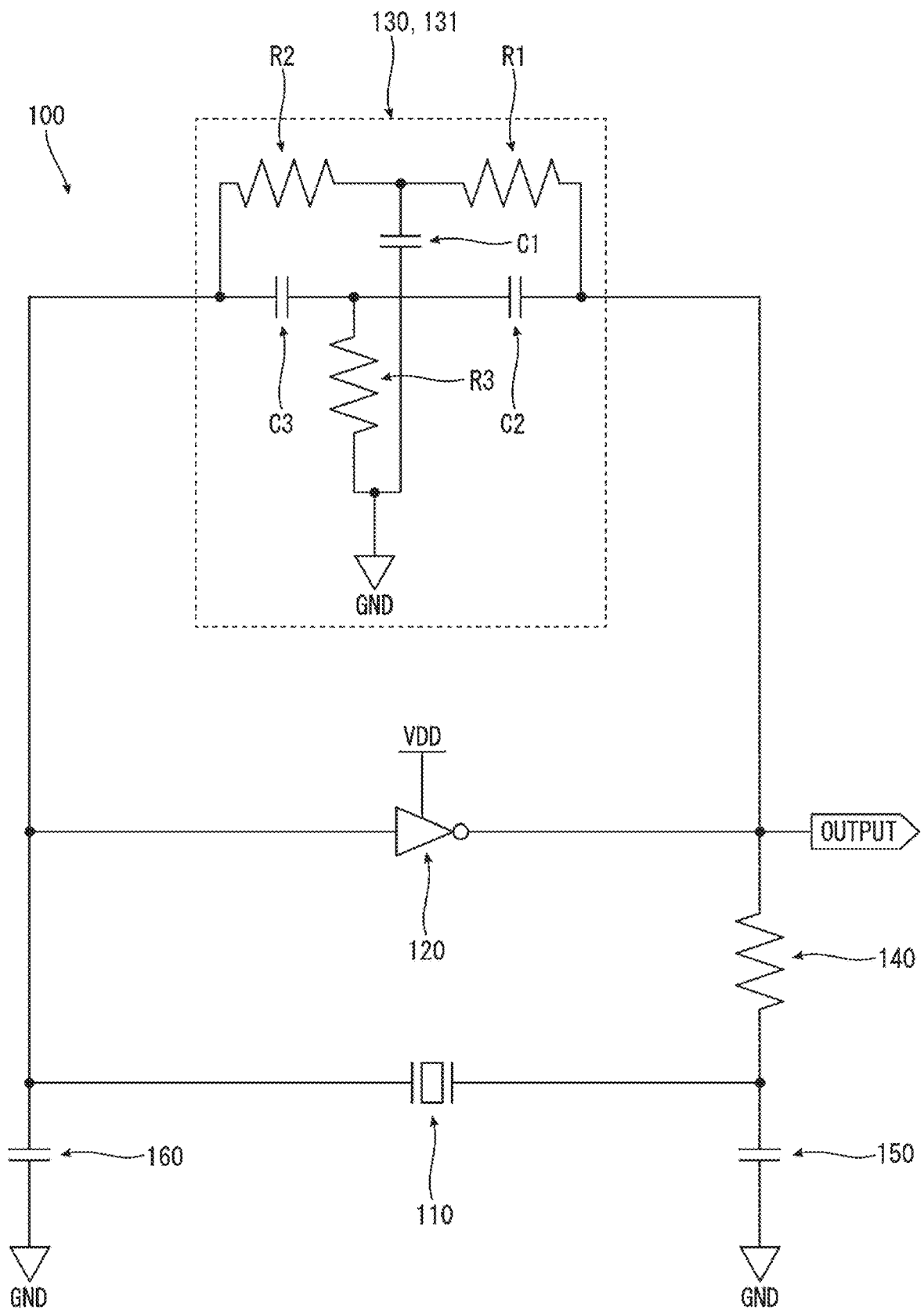
FIG. 1 is a circuit diagram of an oscillator circuit according to a first embodiment.
Figure 2:
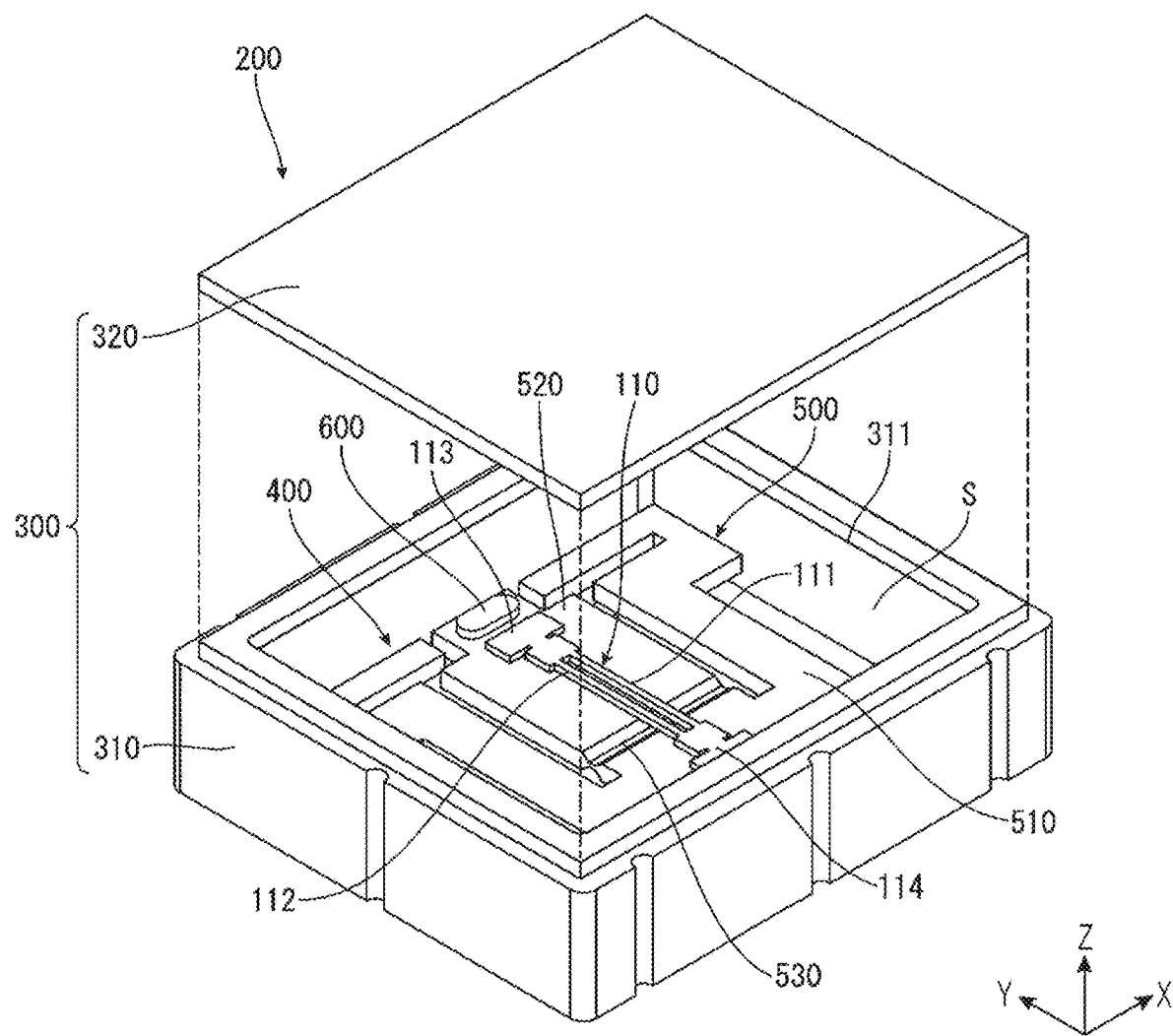
FIG. 2 is an exploded perspective view of an accelerometer.
Figure 3:
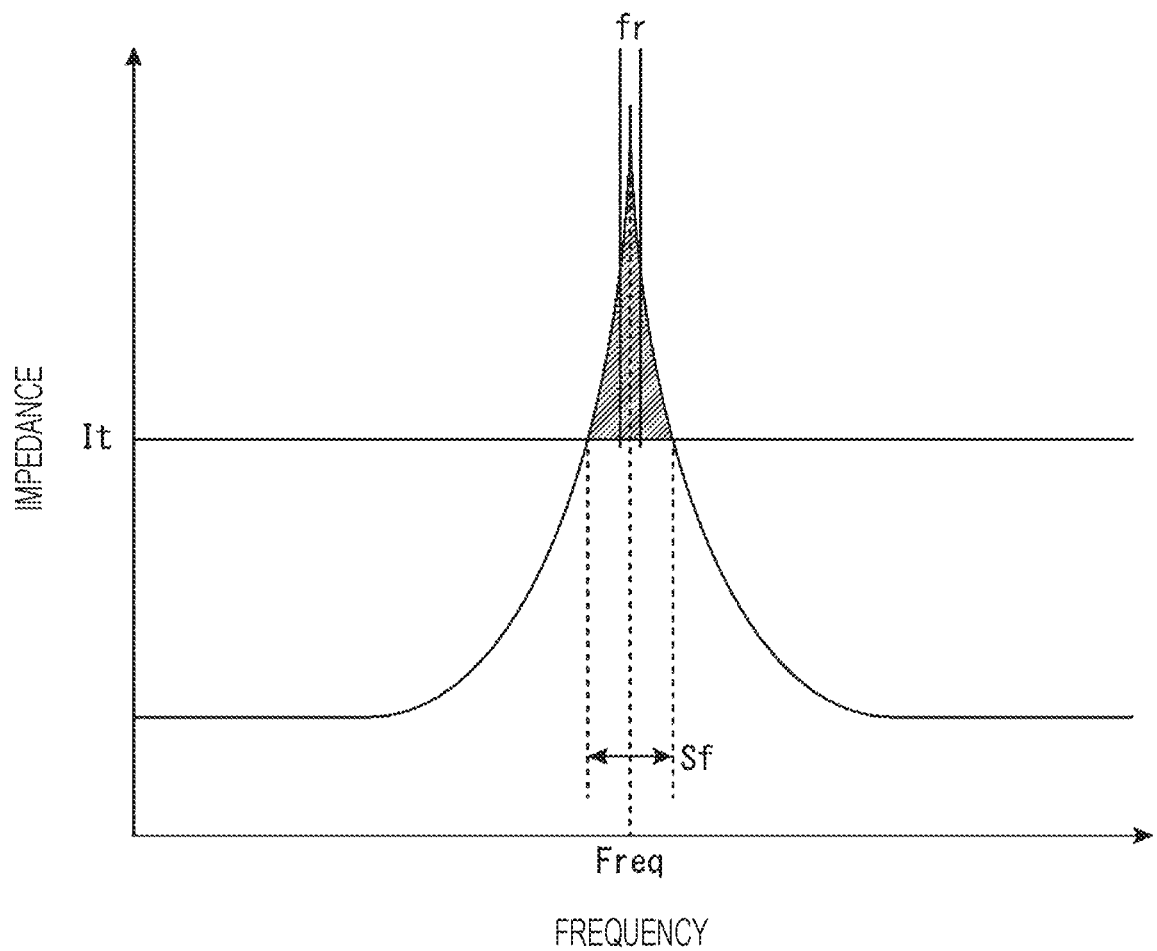
FIG. 3 is a graph illustrating the characteristics of a twin-T notch filter.

FIG. 1 is a circuit diagram of the oscillator circuit according to a first embodiment. FIG. 2 is an exploded perspective view of an accelerometer. FIG. 3 is a graph illustrating the characteristics of a twin-T notch filter.

An oscillator circuit 100 illustrated in FIG. 1 is a Colpitts type oscillator circuit that oscillates at a predetermined frequency and includes a crystal oscillator 110, an inverter 120, a feedback resistor 130, a limiting resistor 140, a first load capacitor 150, and a second load capacitor 160.

Among these elements, the crystal oscillator 110, the inverter 120, and the feedback resistor 130 are coupled in parallel with each other. The limiting resistor 140 is coupled between the output end of the inverter 120 and the input end of the crystal oscillator 110. The first load capacitor 150 is coupled between the input end of the crystal oscillator 110 and ground. The second load capacitor 160 is coupled between the output end of the crystal oscillator 110 and ground. In this regard, the first load capacitor 150 and the second load capacitor 160 may be coupled to a power source VDD instead of ground.

The crystal oscillator 110 is mounted on an accelerometer 200. Accordingly, before specifically describing the oscillator circuit 100, a brief description will be given of the accelerometer 200 with reference to FIG. 2. In this regard, for convenience of explanation, an X-axis, a Y-axis, and a Z-axis that are orthogonal to each other are illustrated in FIG. 2. The accelerometer 200 is a sensor that detects acceleration in a direction along the Z-axis (hereinafter also referred to as a Z-axis direction) and includes a package 300 and an accelerometer element 400 accommodated in the package 300 as illustrated in FIG. 2.

The package 300 includes a base 310 having a recess 311 with an opening on a top surface and a plate-shaped lid 320 that is joined to the top surface of the base 310 and closes the opening of the recess 311. An airtight space S is formed inside the package 300, and the accelerometer element 400 is accommodated in the airtight space S.

The accelerometer element 400 includes a substrate structure 500 fixed to the base 310, the crystal oscillator 110 disposed on the substrate structure 500, and a weight section 600 disposed on the substrate structure 500.

The substrate structure 500 is formed by a crystal substrate and forms a planar shape in an X-Y plane which is orthogonal to the Z-axis. Also, the substrate structure 500 includes a support section 510, a movable section 520 that is to be displaced in the Z-axis direction with respect to the support section 510, and a joint section 530 located between the support section 510 and the movable section 520 and is fixed to the base 310 at three places of the support section 510. The movable section 520 is supported on one end by the support section 510 like a cantilever. A joint section 530, which is thin with respect to the support section 510 and the movable section 520, is disposed between the support section 510 and the movable section 520. The movable section 520 is likely to be displaced in the Z-axis direction with respect to the support section 510 by the joint section 530 functioning as a hinge.

The crystal oscillator 110 is a twin-tuning-fork type oscillator formed by a crystal substrate. The crystal oscillator 110 also includes two oscillation beams 111 and 112, a first base section 113 that terminates at one end of the two oscillation beams 111 and 112, and a second base section 114 that terminates at the other end thereof. The oscillation beams 111 and 112 of the crystal oscillator 110 are disposed along the Y-axis. The crystal oscillator 110 is joined to the movable section 520 at the first base section 113 and joined to the support section 510 at the second base section 114. The crystal oscillator 110 also includes a pair of excitation electrodes, which are not illustrated, disposed on the respective surfaces of the oscillation beams 111 and 112. When an AC voltage drive signal is applied between the excitation electrodes, the oscillation beams 111 and 112 bend and oscillate in the X-axis direction so as to repeatedly move closer to and apart from each other in the X-axis direction.

The weight section 600 is joined to the tip section of the movable section 520. By disposing the weight section 600 on the movable section 520, the mass of the movable section 520 is increased. Accordingly, the movable section 520 becomes easier to be displaced with small acceleration, and thus the resolution of the accelerometer 200 is improved.

With the accelerometer 200, it is possible to detect acceleration in the Z-axis direction as follows. When acceleration is applied to the accelerometer 200 in the Z-axis direction, the movable section 520 is displaced in the Z-axis direction with respect to the support section 510 with the joint section 530 as a fulcrum. Tensile stress or compressive stress is applied to the crystal oscillator 110 due to the displacement, and the resonant frequency of the crystal oscillator 110 changes in accordance with the applied stress. Specifically, when receiving acceleration in the positive Z-axis direction, the movable section 520 is displaced in the negative Z-axis direction with respect to the support section 510. Thereby tensile stress is applied to the crystal oscillator 110 to increase the resonant frequency of the crystal oscillator 110. On the other hand, when receiving acceleration in the negative Z-axis direction, the movable section 520 is displaced in the positive Z-axis direction with respect to the support section 510. Thereby compressive stress is applied to the crystal oscillator 110 to decrease the resonant frequency of the crystal oscillator 110. Accordingly, the accelerometer 200 is able to detect acceleration in the Z-axis direction in accordance with a change in the resonant frequency of the crystal oscillator 110.

In the above, a brief description has been given of the accelerometer 200. However, the configuration of the accelerometer 200 is not particularly limited. Also, the configuration of the crystal oscillator 110 is not particularly limited.

Returning back the description of the oscillator circuit 100. The inverter 120 is coupled between the power source VDD and ground. The inverter 120 according to the present embodiment is a CMOS inverter. By using a CMOS inverter for the inverter 120, it is possible to easily increase its gain. Also, the oscillator circuit 100 has low power consumption. However, as long as the inverter 120 performs its functions, the inverter 120 is not particularly limited.

The feedback resistor 130 is coupled in parallel to the inverter 120. In the oscillator circuit 100, the feedback resistor 130 feeds back a signal from the output portion of the inverter 120 to continue the oscillation of the crystal oscillator 110. Also, the limiting resistor 140 is coupled between the output end of the inverter 120 and the input end of the crystal oscillator 110. In the oscillator circuit 100, by using the limiting resistor 140, it is possible to control the current flowing to the crystal oscillator 110, adjust the negative resistor and the excitation level, and suppress the abnormal oscillation and the frequency fluctuations of the crystal oscillator 110. Also, the first load capacitor 150 is coupled between the input end of the crystal oscillator 110 and ground, and the second load capacitor 160 is coupled between the output end of the crystal oscillator 110 and ground. In the oscillator circuit 100, by using the first load capacitor 150 and the second load capacitor 160, it is possible to adjust the negative resistor, the excitation level, the oscillation frequency, and the like.

Next, a detailed description will be given of the feedback resistor 130. As illustrated in FIG. 1, the feedback resistor 130 is constituted by a twin-T notch filter 131, which is a band stop filter. Thereby, it becomes easy to configure the band stop filter. The twin-T notch filter 131 is constituted by three resistors R1, R2, and R3, and three capacitors C1, C2, and C3. Specifically, two resistors R1 and R2 coupled in series, and two capacitors C2 and C3 coupled in series are coupled in parallel. The capacitor C1 is coupled between the resistors R1 and R2, and ground. The resistor R3 is coupled between the capacitors C2 and C3, and ground.

With the twin-T notch filter 131, it is possible to obtain a desired center attenuation frequency Freq by adjusting the resistor values of the individual resistors R1 to R3 and the capacitance values of the individual capacitors C1 to C3. For example, assuming that R1=R2=R, R3=R/2, C2=C3=C, and C1=C2, the attenuation becomes the maximum value when Freq=$1/(2\pi RC)$. That is, with the twin-T notch filter 131, it is possible to increase the impedance only in the vicinity of the center attenuation frequency Freq. On the other hand, the feedback resistor 130 needs to have an impedance equal to or higher than a threshold value It for the signal amplification using the inverter 120.

Therefore, as illustrated in FIG. 3, the inverter 120 amplifies only the signal having frequency components included in a rejection band Sf which is a frequency band equal to or higher than the threshold value It. Accordingly, as illustrated in FIG. 3, in the oscillator circuit 100, the twin-T notch filter 131 is configured so that a resonant frequency fr of the crystal oscillator 110 is included in the rejection band Sf, more preferably, the resonant frequency fr is located at the center of the rejection band Sf. Thereby, the signal produced by amplifying only the signal having the frequency components of the resonant frequency fr and its vicinity are input from the inverter 120 to the crystal oscillator 110 via the limiting resistor 140. The signal output from the crystal oscillator 110 is positively fed back to be input to the inverter 120. In this regard, as described above, in the accelerometer 200, the resonant frequency fr of the crystal oscillator 110 fluctuates due to the received acceleration, and thus in the present embodiment, the twin-T notch filter 131 is configured so that the full range of the fluctuations of the resonant frequency fr is included in the rejection band Sf.

In this manner, by using the twin-T notch filter 131 for the feedback resistor 130, it is possible to amplify only the signal of the frequency components included in the rejection band Sf. Therefore, it is possible to keep noise low compared with the case of configuring the feedback resistor 130 with a single resistor as the related art. Accordingly, the oscillator circuit 100 has excellent noise characteristics.

In the above, a description has been given of the oscillator circuit 100. As described above, the oscillator circuit 100 includes: the inverter 120; the crystal oscillator 110 coupled in parallel to the inverter 120; the first load capacitor 150 coupled to the input portion of the crystal oscillator 110; the second load capacitor 160 coupled to the output portion of the crystal oscillator 110; and the twin-T notch filter 131 coupled in parallel to the inverter 120 and working as a band stop filter having the rejection band Sf including the resonant frequency fr of the crystal oscillator 110. With the oscillator circuit 100 having such a configuration, only the signal having frequency components included in the rejection band Sf is amplified by the inverter 120 and input to the crystal oscillator 110. Accordingly, it is possible to keep noise low, and thus the oscillator circuit 100 has excellent noise characteristics.

Also, as described above, the band stop filter is the twin-T notch filter 131. Thereby, the configuration of the band stop filter becomes simple.

Also, as described above, the inverter 120 is a CMOS inverter. Thereby, it is possible to easily increase its gain. Also, the oscillator circuit 100 has low power consumption.

Also, as described above, the oscillator circuit 100 includes the limiting resistor 140 coupled between the output portion of inverter 120 and the crystal oscillator 110. Thereby, it is possible to control the current flowing into the crystal oscillator 110, adjust the negative resistor and the excitation level, and suppress abnormal oscillation and frequency fluctuations of the crystal oscillator 110.

Second Embodiment

Figure 4:
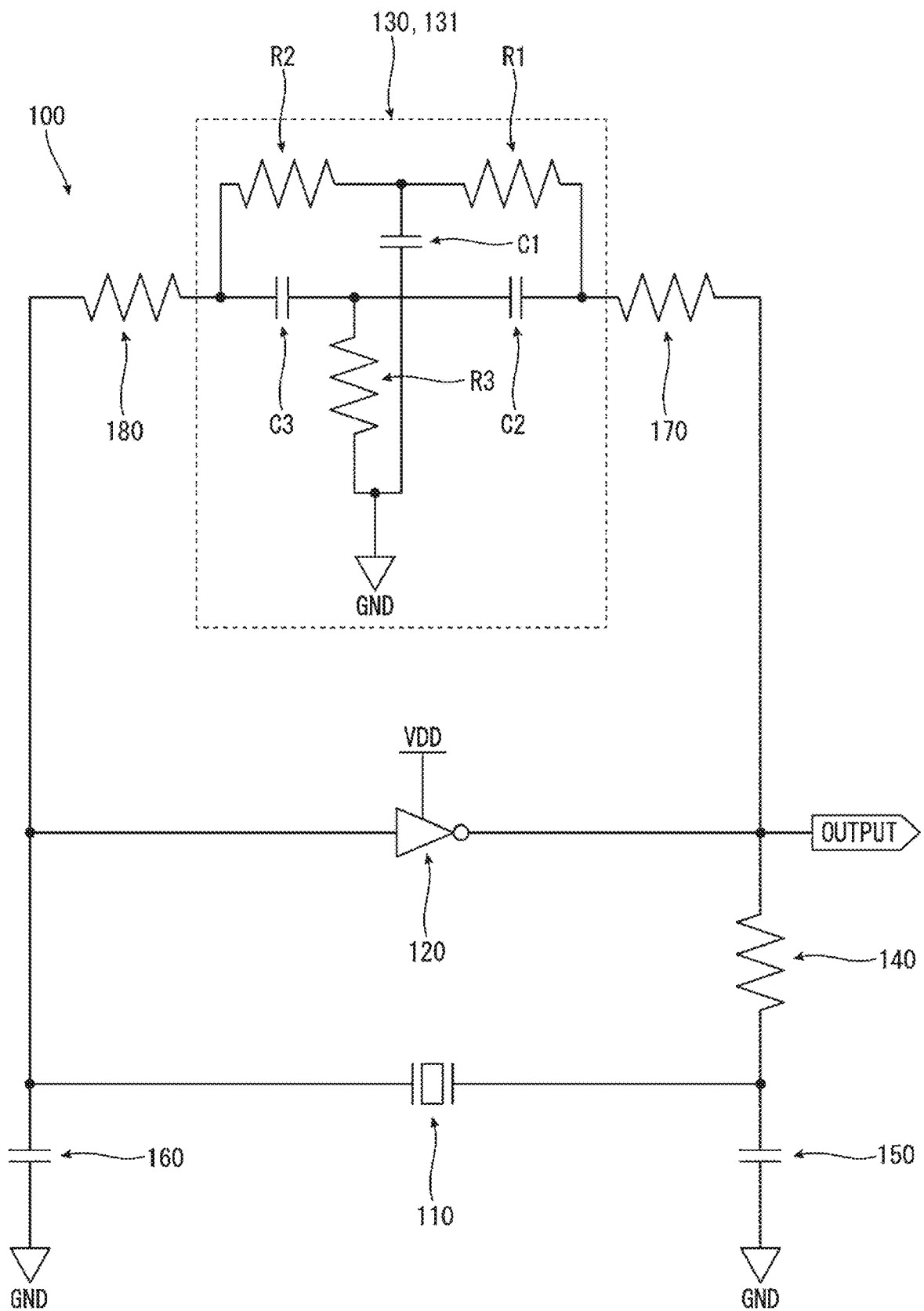
FIG. 4 is a circuit diagram of an oscillator circuit according to a second embodiment.
Figure 5:
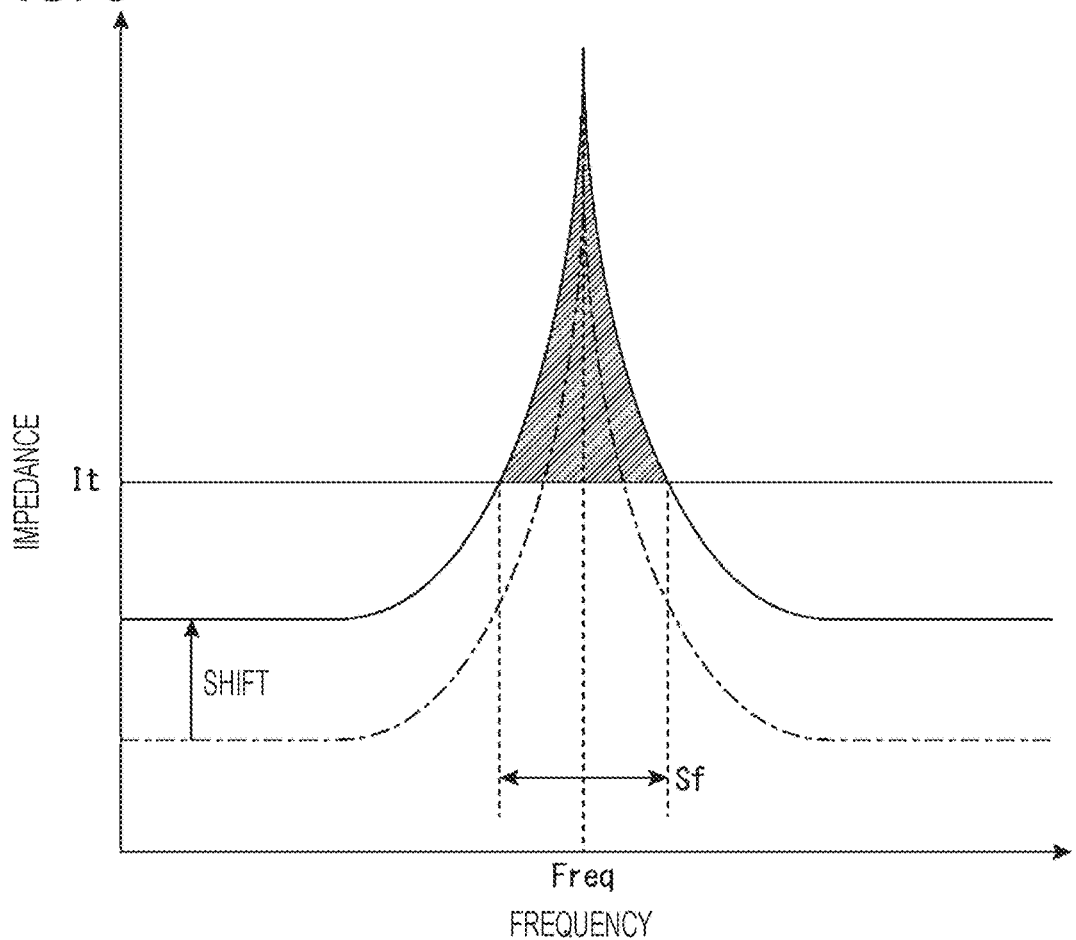
FIG. 5 is a graph illustrating the characteristics of a twin-T notch filter.
Figure 6:
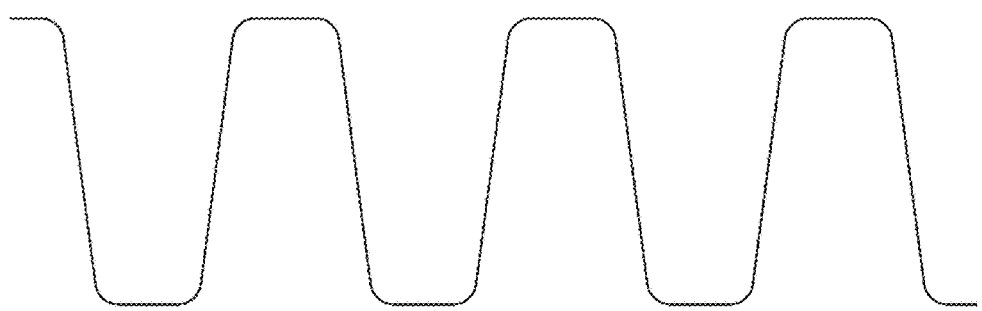
FIG. 6 is a diagram illustrating a waveform of an oscillation signal.
Figure 7:
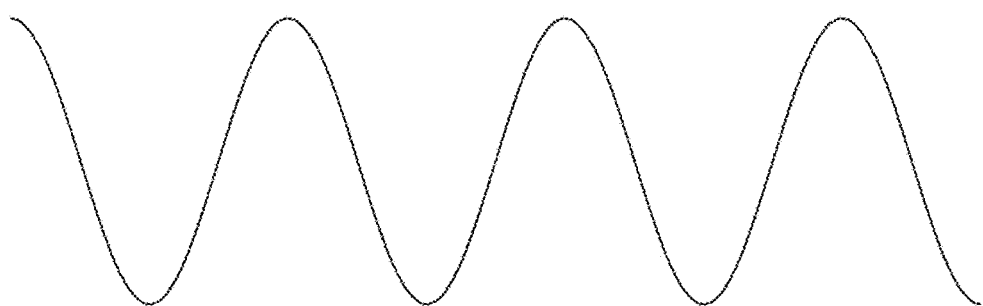
FIG. 7 is a diagram illustrating a waveform of an oscillation signal.

FIG. 4 is a circuit diagram of an oscillator circuit according to a second embodiment. FIG. 5 is a graph illustrating the characteristics of a twin-T notch filter. FIG. 6 and FIG. 7 are diagrams illustrating the corresponding waveforms of respective oscillation signals.

An oscillator circuit 100 according to the present embodiment is the same as the above-described oscillator circuit 100 according to the first embodiment except that a first offset resistor 170 and a second offset resistor 180 are further included. In this regard, in the following description, regarding the oscillator circuit 100 according to the present embodiment, a description will be given mainly of the differences from those of the first embodiment described above, and a description will be omitted of the same matters. Also, in the drawings of the present embodiment, the same signs are added to the same components as those in the first embodiment.

As illustrated in FIG. 4, the oscillator circuit 100 according to the present embodiment further includes the first offset resistor 170 and the second offset resistor 180 that are coupled to the corresponding ends of the twin-T notch filter 131 in addition to the configuration of the first embodiment described above. The first offset resistor 170 is coupled between the output portion of the inverter 120 and the input portion of the twin-T notch filter 131, and the second offset resistor 180 is coupled between the output portion of the twin-T notch filter 131 and the input portion of the inverter 120. In the present embodiment, the first offset resistor 170 and the second offset resistor 180 have the same resistance value. However, the present disclosure is not limited to this, and they may have different resistance values with each other.

The first and second offset resistors 170 and 180 have a function of offsetting the characteristics of the twin-T notch filter 131. Specifically, as illustrate in FIG. 5, the higher the resistance values of the first and second offset resistors 170 and 180, the more the characteristics of the twin-T notch filter 131 are shifted upward without change. As the characteristics are shifted, the rejection band Sf is expanded as much as shifted. In this manner, by disposing the first and the second offset resistors 170 and 180 and adjusting the resistance values of the first and the second offset resistors 170 and 180, it is possible to adjust the range of the rejection band Sf in any way, and thus it becomes easy to perform noise design.

Also, the waveform of the oscillation signal output from the oscillator circuit 100 is determined by the overall value of phase noise and amplitude noise. The wider the rejection band Sf by increasing the resistance values of the first and second offset resistors 170 and 180, the closer the oscillation signal comes to a rectangular wave as illustrated in FIG. 6, and the lower the amplitude noise becomes. On the other hand, the narrower the rejection band Sf by decreasing the resistance values of the first and second offset resistors 170 and 180, the closer the oscillation signal comes to a sine wave as illustrated in FIG. 7, and the lower the phase noise becomes. Accordingly, by optimizing the resistance values of the first and second offset resistors 170 and 180, it is possible to easily adjust the waveform in accordance with the characteristics of the frequency counter to be used, and to adjust the waveform so as to minimize the overall value of phase noise and amplitude noise.

Further, it is possible to suppress overcurrent by disposing the first and second offset resistors 170 and 180. Specifically, as illustrated in FIG. 5, in the twin-T notch filter 131, the further away from the center attenuation frequency Freq, the lower the impedance becomes. Accordingly, when a signal having a frequency component significantly away from the center attenuation frequency Freq is output from the inverter 120, the output portion of the inverter 120 and the input portion thereof are short-circuited. In this regard, the "short circuit" includes the state of being coupled at low impedance. Accordingly, the output signal of the inverter 120 might be applied to the input portion of the inverter 120 to cause an overcurrent, and thus the circuit might be damaged. To deal with this problem, by disposing the first and second offset resistors 170 and 180, the current value input to the inverter 120 is limited, and it is possible to effectively suppress the damage of the circuit as described above.

As described above, the oscillator circuit 100 according to the present embodiment includes: the first offset resistor 170 coupled between the output portion of the inverter 120 and the twin-T notch filter 131; and the second offset resistor 180 coupled between the twin-T notch filter 131 and the input portion of the inverter 120. In this manner, by disposing the first and second offset resistors 170 and 180, it is possible to adjust the range of the rejection band Sf in any way, and thus noise design becomes easy. Also, by optimizing the first and second offset resistors 170 and 180, it is possible to easily adjust the waveform in accordance with the characteristics of the frequency counter to be used, and to adjust the waveform so as to minimize the overall value of phase noise and amplitude noise. Also, it is possible to limit the value of the current input to the inverter 120, and to effectively suppress the damage of the circuit.

With the second embodiment as described above, it is possible to obtain the same advantages as those of the first embodiment described above.

In the above, the descriptions have been given of the oscillator circuit according to the present disclosure in accordance with the embodiments with reference to the drawings. However, the present disclosure is not limited to these. It is possible to replace the configuration of each section with any configuration having the same function. Also, any other component may be added to the present disclosure. Also, the present disclosure may be made with a combination of any two components out of the individual embodiments described above.

Also, in the embodiments described above, the twin-T notch filter 131 is used as a band stop filter. However, the present disclosure is not limited to this. For example, an active notch filter may be used, and a filter other than the notch filter may be used.

Also, the embodiments described above include one inverter 120 and one twin-T notch filter 131 coupled in parallel to the inverter 120. However, the present disclosure is not limited to this. For example, the present disclosure may have a configuration including a plurality of inverters 120 coupled in series and a plurality of twin-T notch filters 131 coupled in parallel to the corresponding inverters 120.

Also, in the embodiments described above, the crystal oscillator 110 is used as an accelerometer element for detecting acceleration. However, the present disclosure is not limited to this. For example, the crystal oscillator 110 may be used as an angular velocity sensor element for detecting angular velocity or may be used as an oscillation element that produces an oscillation signal oscillating at a predetermined frequency. Also, the crystal oscillator 110 may be used for an application other than these.

What is claimed is:

1. An oscillator circuit comprising:
   an inverter;
   a crystal oscillator coupled in parallel to the inverter;
   a first load capacitor coupled to an input portion of the crystal oscillator;
   a second load capacitor coupled to an output portion of the crystal oscillator; and
   a band stop filter coupled in parallel to the inverter and having a rejection band including a resonant frequency of the crystal oscillator.

2. The oscillator circuit according to claim 1, wherein the band stop filter is a twin-T notch filter.

3. The oscillator circuit according to claim 1, further comprising:
   a first offset resistor coupled between an output portion of the inverter and the band stop filter; and
   a second offset resistor coupled between the band stop filter and an input portion of the inverter.

4. The oscillator circuit according to claim 1, wherein the inverter is a CMOS inverter.

5. The oscillator circuit according to claim 1, further comprising
   a limiting resistor coupled between an output portion of the inverter and the crystal oscillator.

\* \* \* \* \*